(12) United States Patent
Vincent et al.

(10) Patent No.: US 9,029,217 B1
(45) Date of Patent: May 12, 2015

(54) BAND ENGINEERED SEMICONDUCTOR DEVICE AND METHOD FOR MANUFACTURING THEREOF

(71) Applicants: IMEC, Leuven (BE); GlobalFoundries Inc., Grand Cayman (KY)

(72) Inventors: Benjamin Vincent, San Francisco, CA (US); Geert Hellings, Heverlee (BE); David Paul Brunco, Tervuren (BE)

(73) Assignees: IMEC, Leuven (BE); GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/592,412

(22) Filed: Jan. 8, 2015

Related U.S. Application Data

(62) Division of application No. 14/024,820, filed on Sep. 12, 2013, now Pat. No. 8,963,225.

(60) Provisional application No. 61/701,452, filed on Sep. 14, 2012.

(51) Int. Cl.
| | |
|---|---|
| *H01L 21/336* | (2006.01) |
| *H01L 29/94* | (2006.01) |
| *H01L 29/66* | (2006.01) |
| *H01L 29/161* | (2006.01) |
| *H01L 21/02* | (2006.01) |
| *H01L 29/10* | (2006.01) |

(52) U.S. Cl.
CPC ........ *H01L 29/66795* (2013.01); *H01L 29/161* (2013.01); *H01L 21/02532* (2013.01); *H01L 21/0257* (2013.01); *H01L 29/1054* (2013.01)

(58) Field of Classification Search
USPC .......... 257/308, 319, 441, E29.089, E29.245; 438/267–271
See application file for complete search history.

(56) References Cited

U.S. PATENT DOCUMENTS

| | | |
|---|---|---|
| 2010/0068869 A1 | 3/2010 | Vincent et al. |
| 2010/0144121 A1 | 6/2010 | Chang et al. |
| 2011/0147811 A1 | 6/2011 | Kavalieros et al. |
| 2012/0309173 A1 | 12/2012 | Shah et al. |
| 2014/0175543 A1 | 6/2014 | Glass et al. |

OTHER PUBLICATIONS

Eshed, Anat et al., "Stress Induced Lateral Concentration Profiles in SiGe Layers Grown on Si(001) Non-Planar Substrates", Materials Research Society Symposium Proceedings, vol. 664, pp. A8.3.1-A8.3.6.

*Primary Examiner* — Calvin Lee
(74) *Attorney, Agent, or Firm* — McDonnell Boehnen Hulbert & Berghoff LLP

(57) ABSTRACT

The disclosure is related to a band engineered semiconductor device comprising a substrate and a protruding structure that is formed in a recess in the substrate. The protruding structure extends above the recess and has a buried portion and an extended portion. At least the extended portion comprises a semiconductor material having an inverted 'V' band gap profile with a band gap value increasing gradually from a first value at lateral edges of the structure to a second value, higher than the first value, in a center of the structure. The disclosure is also related to the method of manufacturing of such a band engineered semiconductor device.

8 Claims, 7 Drawing Sheets

BAND ENGINEERED SEMICONDUCTOR DEVICE AND METHOD FOR MANUFACTURING THEREOF

CROSS REFERENCE TO RELATED APPLICATIONS

The present application is a divisional of U.S. patent application Ser. No. 14/024,820 filed on Sep. 12, 2013 now U.S. Pat. No. 8,963,225 issued Feb. 24, 2015, which claims priority to U.S. Provisional Patent Application Ser. No. 61/701,452 filed Sep. 14, 2012, the entire contents of each of which are incorporated herein by reference.

FIELD OF THE DISCLOSURE

The present invention is related to a band engineered semiconductor device, more specifically with a FinFET device and the method of manufacturing thereof.

BACKGROUND OF THE DISCLOSURE

Continued scaling of planar MOSFET transistors give rise to increased short channel effects. This has sparked interest in alternative transistor architectures, such as Silicon-On-Insulator FETs, Quantum Well (QW)-based FETs (such as e.g. the implant free quantum well IFQW pFET) and multi-gate FETs (MUGFETs or FinFETs).

However there is further need to improve the performance of the new transistor architectures with respect to the short channel control in order to reduce the OFF-state leakage current.

SUMMARY OF THE DISCLOSURE

In a first aspect, the disclosure is related to a semiconductor device comprising a substrate and a protruding structure which is formed in a recess in the substrate and is extending above the recess having a buried portion and an extended portion, and wherein at least the extended portion comprises a semiconductor material having an inverted 'V' band gap profile with a band gap value increasing gradually from a first value at lateral edges of the structure to a second value, higher than the first value, in a center of the structure.

In embodiments of the disclosure, both the extended portion and the buried portion comprise a semiconductor material having an inverted 'V' band gap profile.

In embodiments of the disclosure, the recess has a bottom area which exposes the substrate and lateral walls comprising a dielectric material.

In some embodiments of the disclosure, the semiconductor material of the protruding structure comprises silicon germanium (SiGe) and the band gap profile is created by a gradient in Ge concentration, with the highest Ge concentration at the lateral edges of the protruding structure.

In embodiments of the disclosure, Ge concentration at the lateral edges is between 60 at % and 100 at %.

Further, in embodiments of the disclosure, Ge concentration in the center is between 40 at % and 60 at %.

In embodiments of the disclosure, the substrate is silicon and the dielectric material is silicon oxide.

In embodiments of the disclosure, the semiconductor material may further comprise dopants.

Furthermore, the protruding structure may comprise two or more layers, the layers being stacked vertically and each layer may comprise a semiconductor material having an inverted 'V' band gap profile with a band gap value increasing gradually from a first value at the lateral edges of the structure to a second value higher than the first value in the center of the structure.

In various embodiments of the disclosure, the protruding structure forms a fin.

In particular embodiments of the disclosure, the fin has a tapered shape having a smaller width at a top of the extended portion.

In specific embodiments, the fin may further comprise a capping layer formed conformal around the extended portion of the protruding structure.

In particular embodiments, the capping layer is made of SiGe or Ge, wherein SiGe has a Ge concentration higher than 60 at %.

Further, the device of the disclosure may comprise a multiple gate formed conformal around the fin.

In a second aspect, the disclosure is related to a method for manufacturing a semiconductor device comprising a number of steps. The method comprises providing a patterned substrate comprising dielectric region and a semiconductor region. The method also comprises forming a recess in the semiconductor region having a bottom area exposing the substrate and lateral walls comprising a dielectric material. The method further comprises forming protruding structures in the recess by growing epitaxial a semiconductor material in the recess filling and overgrowing the recess. The method even further comprises recessing back the dielectric material in the dielectric region revealing an extended portion of the protruding structures, wherein at least the extended portion of the protruding structures comprises a semiconductor material having an inverted 'V' band gap profile with a band gap value increasing gradually from a first value at lateral edges of the structure to a second value higher than the first value in a center of the structure.

The method further comprises performing chemical mechanical polishing to remove any overgrown semiconductor material before recessing back the dielectric material in the dielectric region.

In different embodiments of the disclosure, the semiconductor material is silicon germanium (SiGe) and the band gap profile is created by a gradient in Ge concentration, with the highest Ge concentration at the lateral edges of the protruding structure.

In embodiments of the disclosure, the pressure and the growth temperature during the epitaxial growth of the SiGe are chosen such that a growth front perpendicular to the (111) planes is favored, thereby forming facets at the bottom area of the recess and wherein the facets propagate, but do not completely merge in order to keep a (100) top plane during the epitaxial growth thereby achieving a gradient in Ge concentration.

In specific embodiments, the growth temperature is between about 450° C. and about 700° C. and the pressure is between about 8Torr to about 1 atm.

In particular embodiments, the method may further comprise forming a capping layer conformal around the extended portion of the protruding structure. Preferably, the capping layer is made of Ge or SiGe with a Ge concentration higher than 60 at %.

In embodiments of the disclosure, the semiconductor material further comprises dopants which are introduced by in-situ doping during the epitaxial growth or by implantation after the epitaxial growth.

The method of the disclosure may further comprise forming a gate dielectric and a gate electrode substantially conformal around the extended portion of the protruding structures.

BRIEF DESCRIPTION OF THE DRAWINGS

All drawings are intended to illustrate some aspects and embodiments of the present disclosure. The drawings described are only schematic and are non-limiting.

DETAILED DESCRIPTION OF ILLUSTRATIVE EMBODIMENTS

Figure 1:
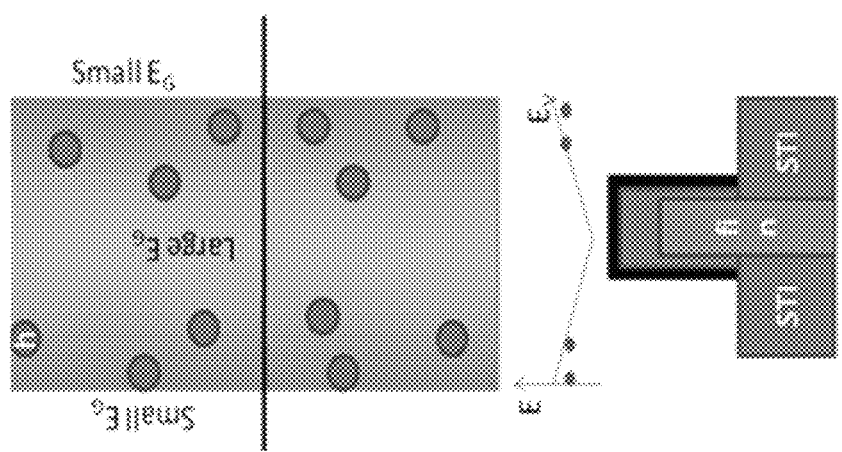
FIG. 1 shows schematically a cross-section through a fin structure according to the disclosure. The band gap has an inverted 'V' profile, i.e., gradually increasing from the edges of the fin to the center of the fin (top picture). The valence band (Ev) energy offset is shown (center plot). A double-gate transistor formed around a fin structure of the disclosure (bottom picture) is also shown.

The present disclosure relates to a semiconductor device having a band engineered structure. Further the disclosure relates to a FinFET device comprising a band engineered structure and a reduced OFF-state leakage current.

Furthermore, the disclosure relates to a method for manufacturing an electronic device with a band engineered structure obtained by epitaxial growth.

The present disclosure will be described with respect to particular embodiments and with reference to certain drawings, but the disclosure is not limited thereto, but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

A MUGFET is a widely used abbreviation for a multi-gate fin-type field effect transistor. An example of MUGFET is the FinFET, which is characterized by the fact that the conducting channel is wrapped by a thin silicon "fin," which forms the body of the device. The thickness of the fin (measured in the direction from source to drain) determines the effective channel length of the device.

In the technical literature, FinFET is used somewhat generically to describe any fin-based, multigate transistor architecture regardless of number of gates.

In OFF-state, the current in FinFETs devices flows in the center of the fin. Unfortunately, it is exactly the center of the fin where the gate control is worse. The ON-current in a FinFET flows in a different location, along the fin sidewalls and top, thus much closer to the gate.

Therefore, in a possible solution to lower the OFF-state leakage of a fin-based device is to make the center of a fin less conductive and/or to reduce the local carrier concentration in the center of the fin.

One way to reduce the charge density in the middle of the fin is by introducing a different material in the center of the fin. The center material has a larger band gap than the "cladding" material or, more precisely, the center material has a band-offset towards the cladding material. In this way a tri-gate device can be built up around the "cladded" fin. However, from a manufacturing perspective, this is not an easy structure to make; one has to make a fin of the center material first, and then start growing the second material on top of this which put a very important challenge to the deposition/growth process.

The present disclosure shows that there is an advantageous alternative for growing "cladding material" on a center material. This alternative is a one-step process, whereby a fin is formed in one growth step, with a gradually changing band gap (band offset). The dual-gate transistor can be formed around the fin structure grown with the method of the disclosure. Such a transistor has all the benefits of a device build around a "cladding" structure and, in addition, other advantages as will be shown herein below. With some additional manufacturing steps the fin structure can be adapted to form a basis for a tri-gate transistor as well.

In order to grow the fin with a gradually changing band gap the epitaxial growth process was adapted such that a semiconductor material (e.g., SiGe) is grown in a narrow recess (e.g. STI trench), with laterally (horizontally) varying concentration. The structure (fin) obtained by such a one-step growth process has a center (middle), which is Si-rich and edges which are Ge-rich. As a result, holes (h+) will be present preferentially in the Ge-rich areas, thus, at the edges and not in the center.

Before forming the gate, the fin obtained with the method of the disclosure has a buried portion and an extended portion. At least the extended portion has a gradually changing band gap, which increases from a first (lower) value at the lateral edges of the fin to a second (higher) value in the center of the fin. Advantageously, both the buried portion and the extended portion of the fin obtained with the method of the disclosure have the gradually changing band gap which increases from a first (lower) value at the lateral edges of the fin to a second (higher) value in the center of the fin.

In a first aspect of the disclosure, a semiconductor device is disclosed comprising a substrate and a protruding structure on the substrate, wherein the protruding structure comprises a semiconductor material having an inverted 'V' band gap profile with a band gap value increasing gradually from a first value at lateral edges of the structure to a second value, higher than the first value, in a center of the structure.

Further, in the first aspect the protruding structure is formed in a recess (trench) which has a bottom area exposing the substrate and sidewalls made of an insulating material (dielectric).

After removing the overgrown semiconductor material and recessing back part of the adjacent (insulating) material, the protruding structure is extending above the remaining recess thereby having a buried portion and an extended portion.

FIG. 1 shows schematically a cross-section through a fin structure of the disclosure. The band gap of the grown semiconductor material has an inverted 'V' profile, i.e., gradually increasing from the edges of the fin to the center of the fin. The valence band (Ev) energy offset is also shown. In the bottom picture of FIG. 1 a double-gate transistor formed around a fin structure of the disclosure is schematically represented. With the label "small $E_G$" it is meant to indicate a material with a conduction/valence band offset for electrons/holes, such that electrons/holes preferentially occupy said material.

In embodiments of the disclosure, the bottom part of the trench (or recess) which exposes the substrate can have either a flat surface or a concave surface as result of the recess forming (etching) process. As soon as facets are formed during the epitaxial growth a horizontal (lateral) gradient in composition is observed. The horizontal gradient in composition corresponds to a gradient in the band gap of the semiconductor material.

Embodiments of the disclosure describe a device wherein at least the extended portion of the protruding structure comprises a semiconductor material having an inverted 'V' band gap profile.

Other embodiments of the disclosure describe a device wherein both the extended portion and the buried portion comprise a semiconductor material having an inverted 'V' band gap profile.

In different embodiments of the first and second aspect of the disclosure, the substrate is silicon (e.g., a silicon wafer). Further in these embodiments, the dielectric material is silicon oxide. Hereinafter, the silicon oxide is also referred to as Shallow Trench Isolation (STI) oxide (2), since it is originating from a previous STI process sequence performed on a bare Si substrate.

In embodiments of the disclosure the semiconductor material of the protruding structure comprises silicon germanium and the band gap profile is created by a gradient in Ge concentration, with the highest Ge concentration at the lateral edges of the protruding structure.

Figure 2:
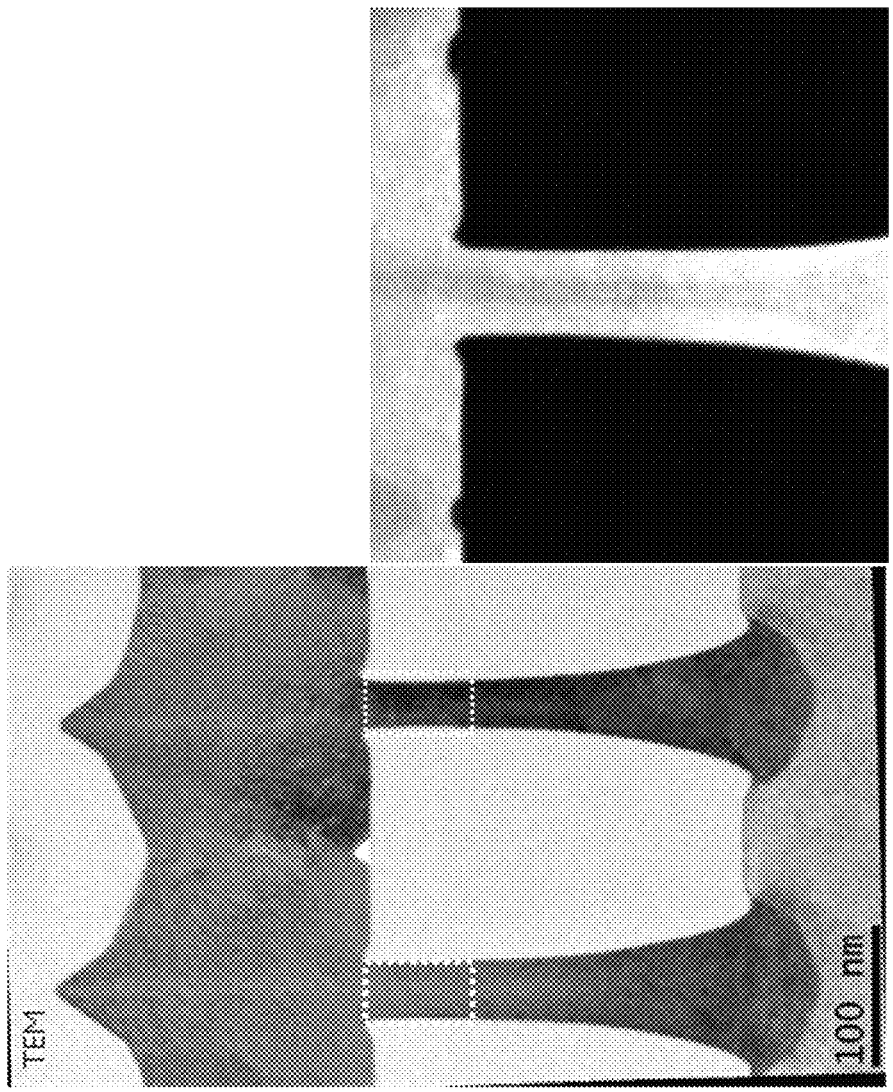
FIG. 2 shows a Transmission Electron Microscopy (TEM) image and Scanning Transmission Electron Microscopy (STEM) image of a structure (fin) grown according to the method of the disclosure.

FIG. 2 shows a Transmission Electron Microscopy (TEM) image and Scanning Transmission Electron Microscopy (STEM) image of a protruding structure (fin) grown according to the method of the disclosure. The lighter portion in the middle of the structure made of SiGe indicates a locally higher Si concentration than at the lateral edges of the fin. The dotted white rectangle on the left picture indicates the portion around which the dual-gate or tri-gate transistor will be formed in the subsequent manufacturing steps.

Figure 3:
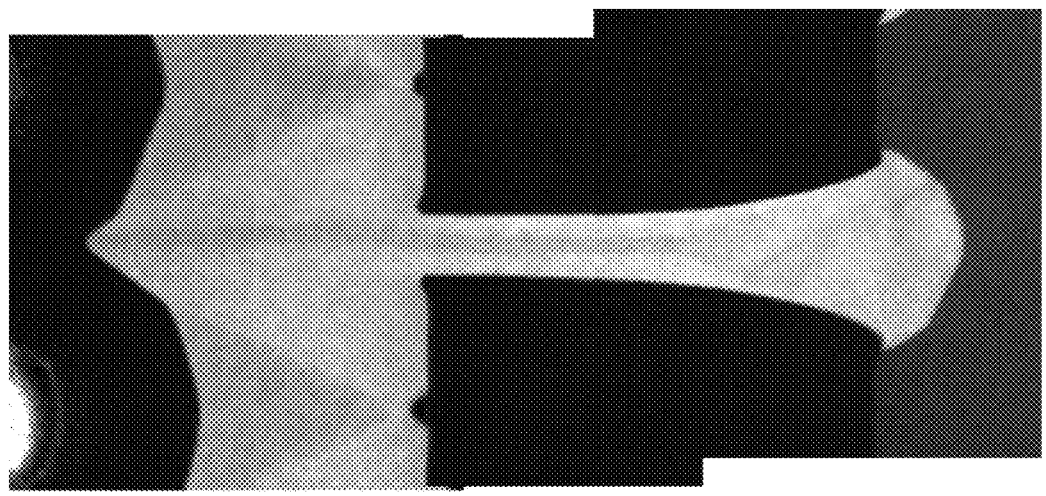
FIG. 3 shows a TEM-image of the structure of the disclosure (right) and the variation of the Ge concentration percentage across the fin width as measured by Energy Dispersive Spectrometry (EDS) (left).
Figure 3:
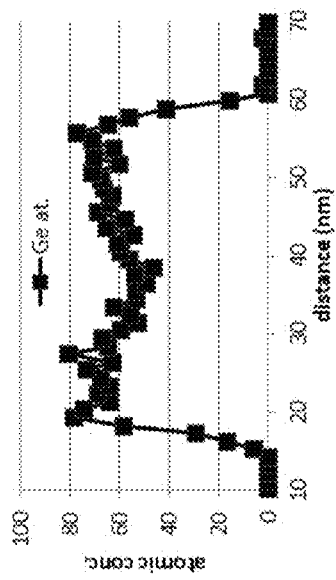

FIG. 3 shows a TEM-image of the protruding structure of the disclosure (right) and the variation of the Ge concentration percentage across the fin width as measured by Energy Dispersive Spectrometry (EDS) (left). From the contrast in the right picture it can be noticed that as soon as facets are formed, Ge lateral gradient is observed. The absolute difference in Ge concentration between the center of the fin structure and the lateral edges amounts about 40 at %.

In specific embodiments of both aspects of the disclosure, Ge concentration at the lateral edges is comprised between 60 at % and 100 at %, Further, in particular embodiments of both aspects of the disclosure, Ge concentration in the center of the structure is comprised between 40 at % and 60 at %.

Figure 6:
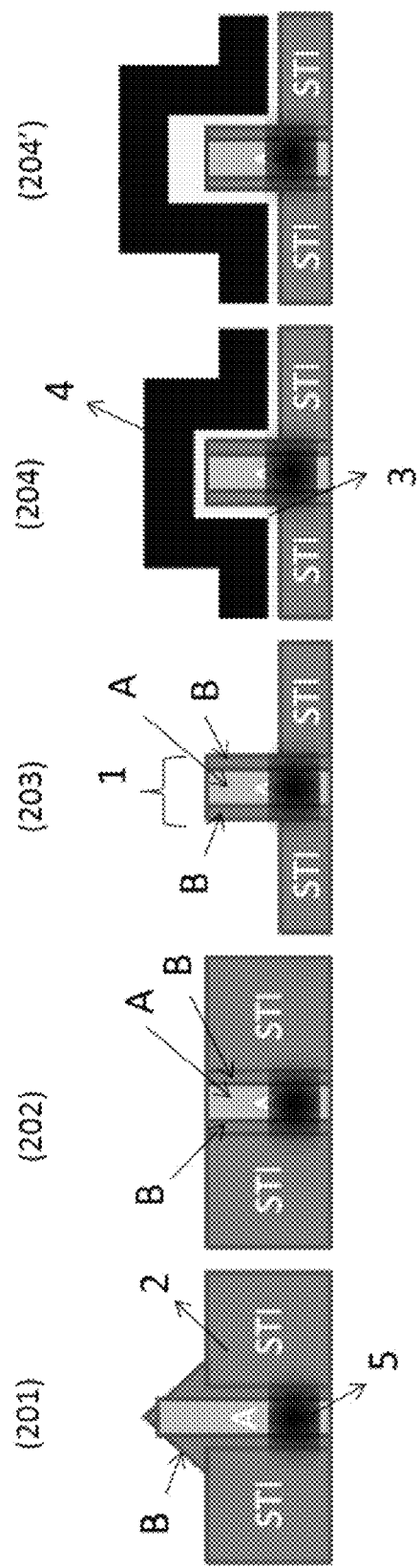
FIG. 6 shows schematically a fabrication process according to another embodiment of the disclosure.

In particular embodiments of the disclosure, the semiconductor material further may comprise dopants (5). The dopants (5) can be localized in the protruding structure as shown in FIG. 6, this configuration bringing additional advantages as shown below.

Figure 7:
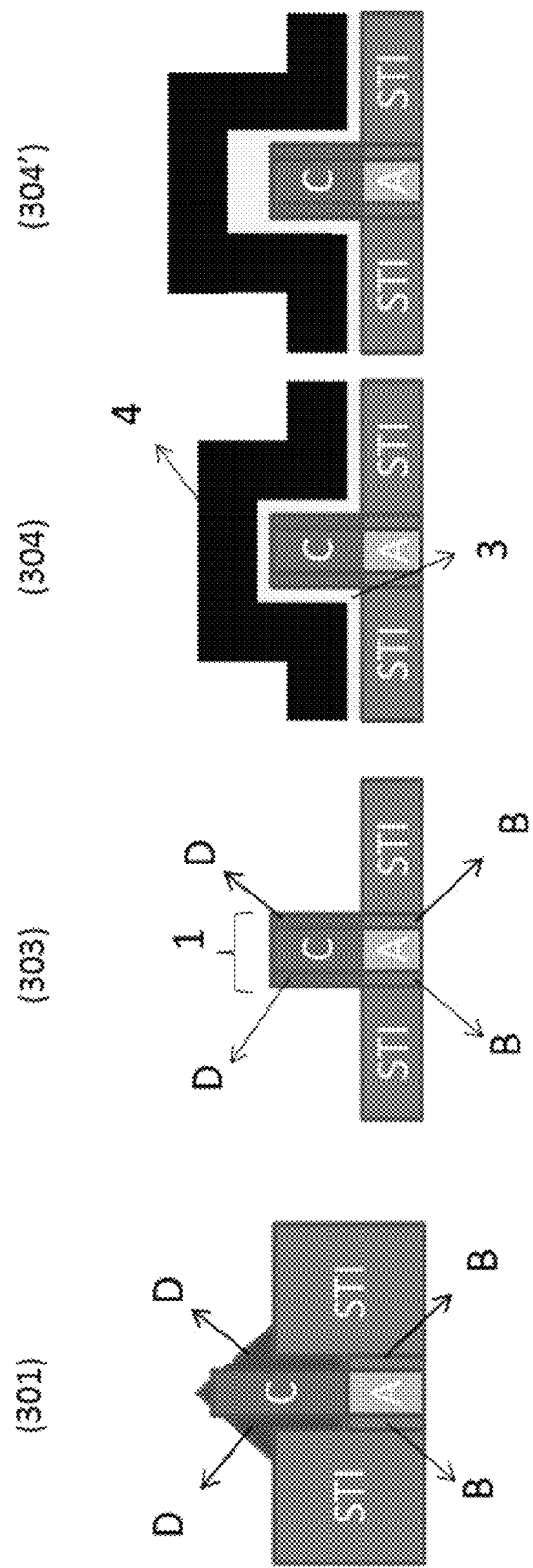
FIG. 7 shows schematically a fabrication process according to yet another embodiment of the disclosure.

Further in embodiments of the disclosure, the semiconductor material of the protruding structure may comprise two or more layers, the layers being stacked vertically as shown in FIG. 7. Each layer comprises a semiconductor material having a horizontal gradient in band gap, increasing from a first value at the edges to a second (higher) value in the center of the structure.

In different embodiments, the protruding structure of the disclosure forms a fin (1) in a multi-gate field effect transistor.

Such a MUGFET further comprises a gate oxide (3) and a gate electrode (4) formed around the fin (1).

In particular embodiments, the fin has a tapered shape having a smaller width at a top of the extended portion.

In embodiments of the disclosure, the fin may further comprise a capping layer formed conformal around the extended portion of the protruding structure. In particular examples, the capping layer comprises SiGe or Ge, wherein SiGe has a Ge concentration higher than 60 at %.

In a second aspect of the disclosure, a method for manufacturing a semiconductor device is disclosed comprising the following steps. First, providing a patterned substrate comprising dielectric region and a semiconductor region. Next, forming a recess in the semiconductor region having a bottom area exposing the substrate and lateral walls (sidewalls) comprising a dielectric material. Then, forming protruding structures in the recess wherein the structures comprise a semiconductor material having an inverted 'V' band gap profile with a band gap value increasing gradually from a first value at lateral edges of the structure to a second value in a center of the structure; the formation of the protruding structures is achieved by growing epitaxial a semiconductor material in the recess filling and overgrowing the recess. The next step in manufacturing a semiconductor device is performing chemical mechanical polishing to remove any overgrown semiconductor material. A further step in manufacturing a semiconductor device is recessing (etching) back the dielectric material in the dielectric region revealing an extended portion of the protruding structures.

In state of the art epitaxial growth of SiGe it is known how to vary the concentration of Ge in a vertical direction, e.g., when filling up from bottom to top a trench with increasing Ge concentration. However, such a technique will create a gradient in Ge concentration only in the vertical direction (a direction parallel to the sidewalls of the trench).

Referring to the epitaxial growth in the method of the disclosure, the semiconductor material (in an example SiGe) is grown such that the Ge concentration is varied on a horizontal direction (perpendicular on the sidewalls of the trench). The gradient in the horizontal direction is the consequence of the lateral growth from a vertical Si seed surface. In order to achieve this, the epitaxial process has to be especially adapted as described below.

More specifically, the pressure and the temperature of the epitaxial growth process of SiGe are chosen such that a growth front perpendicular to the (111) planes is favored, thereby, forming facets at the bottom area of the recess (trench). Subsequently, the facets formed at the bottom area of the recess propagate but do not completely merge such that a (100) top plane is kept during the epitaxial growth, thereby achieving a gradient in Ge concentration in the horizontal direction. It is noted that a horizontal Ge gradient is obtained both in the trench and also on top of the trenches where (100) planes are formed again after the lateral overgrowth planes merge.

Figure 4:
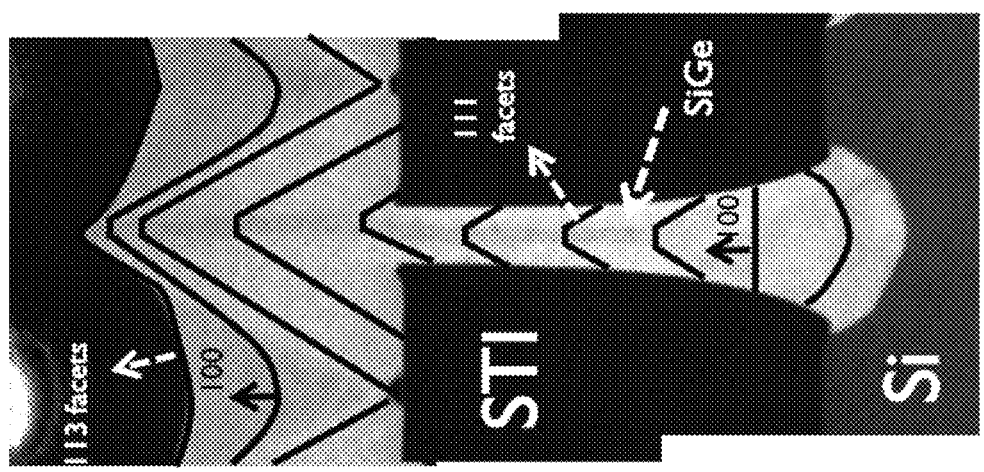
FIG. 4 shows schematically the evolution of the growth plane's orientation during the epitaxial growth of the semiconductor material according to the method of the disclosure.

FIG. 4 shows schematically the evolution of the growth planes orientation during the epitaxial growth of SiGe according to the method of the disclosure.

In embodiments of the first and second aspect of the disclosure, the semiconductor material comprises at least two group IV elements such as Si, Ge, C, or Sn. Preferably, the semiconductor material comprises Si and Ge. More preferably, the semiconductor material is silicon germanium (SiGe).

Further in other embodiments of the first and second aspect of the disclosure the semiconductor material comprises an III-V compound. Preferably, the III-V compound is a ternary III-V compound comprising two group III-elements such as In, Ga, or Al and one group V element such as As or P. More preferably, the III-V compound comprises/consist of InGaAs.

In different embodiments of the second aspect, the growth temperature is between 450° C. and 700° C. while the total pressure in the epitaxial reactor is between 5 Torr and 1 atm.

In the specific and non-limitative example shown in FIG. 4, dichlorosilane ($H_2SiCl_2$, DCS) was used as Si precursor and germane ($GeH_4$) as Ge precursor while $H_2$ was used as carrier gas. The growth temperature was 550° C., total pressure in the reactor 20 Torr and the flows of the precursors and carrier gas as following: 20 sccm DCS, 200 sccm $GeH_4$ and 20 slm $H_2$. The process conditions (temperature and total pressure in the epitaxial reactor, flows or partial pressures of precursors and carrier gas) suitable to grow the semiconductor material such that the growth front perpendicular to the (111) planes is favored and facets are formed at the bottom area of the recess (trench) can be easily identified by those skilled in the art for a particular epitaxial reactor based on the present disclosure. Facets formation is especially favored during the epitaxial growth at low pressure and/or high temperature in the above mentioned ranges.

In various embodiments, the method of the disclosure may further comprise the process steps of forming a gate dielectric and gate electrode substantially conformal around the extended portion of the protruding structures.

Figure 5:
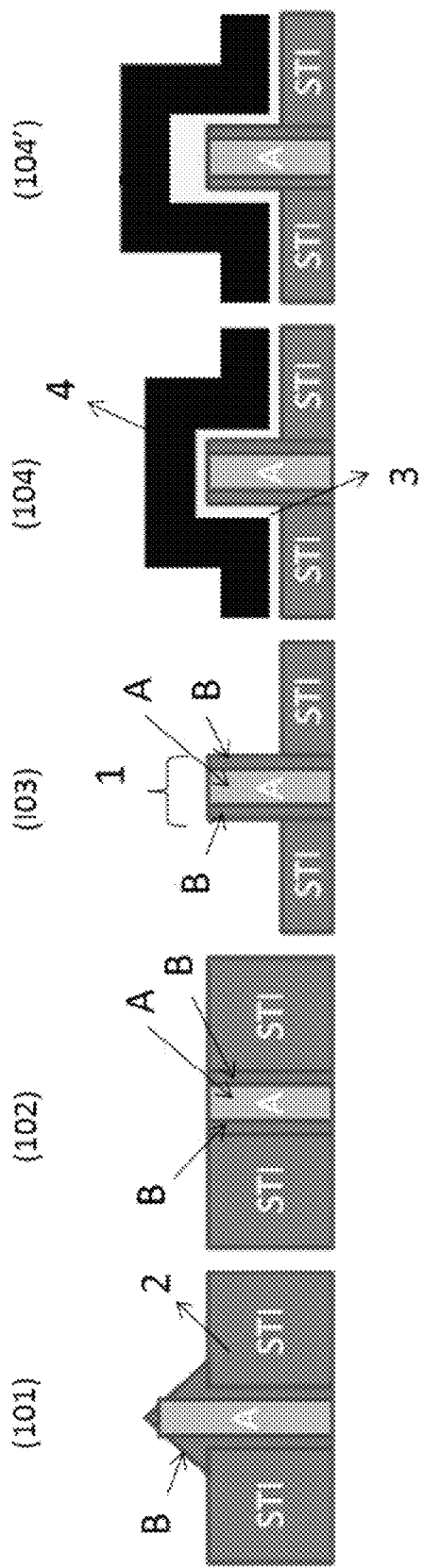
FIG. 5 shows schematically a fabrication process according to an embodiment of the disclosure.

FIG. 5 shows schematically a fabrication process according to an embodiment of the disclosure. The step depicted in (101) shows epitaxial growth of a semiconductor material having a horizontal gradient in composition, e.g., Si-rich SiGe in the center of the structure ("A") and Ge-rich SiGe at the lateral edges of the structure ("B"). The step illustrated in (102) depicts chemical mechanical processing (CMP) of the overgrown semiconductor material. The step (103) illustrates the STI oxide (2) etch back (recess) to expose the fin (1), the exposed portion of the fin is referred herein also as the extended portion of the fin. The step (104) shows the formation of gate oxide (3) and gate electrode (4) around the fin (1) in a tri-gate architecture. The step (104') is an alternative to the step (104), which shows the formation of gate oxide (3) and gate electrode (4) in a dual-gate architecture.

In reference to gate oxide (3), any high-k dielectric material known in the art to be suitable to act as gate dielectric can be implemented in the method of the disclosure. Any metal gate material known in the art to be suitable to act as gate electrode (4) can be implemented in the method of the disclosure. Both the gate dielectric and the gate electrode can be formed by a conformal deposition technique such as Atomic Layer Deposition (ALD) with or without vacuum break in between.

In FIG. 5 the center of the structure having a larger band gap is labeled with "A," while the lateral edges are labeled with "B." It is important to note that this is a schematic representation. In reality, there is no abrupt transition between the band gap value in region/zone "A" of the semiconductor material and the band gap value in region/zone "B" of the same semiconductor material. The band gap variation is gradual and continuous, increasing in a horizontal direction from the edge to the center of the structure and in this way achieving an inverted 'V' profile.

In embodiments of the second aspect, the semiconductor material further comprises dopants (5), which are introduced by in-situ doping during the epitaxial growth. In alternative embodiments the dopants are introduced by implantation after the epitaxial growth.

FIG. 6 shows schematically a fabrication process according to an embodiment of the disclosure, wherein dopants are introduced during epitaxial growth. The step depicted in (201) shows epitaxial growth of a semiconductor material with a horizontal gradient in composition, region (5) represents doping introduced during epitaxial growth. The doping has an abrupt profile intended for s/d isolation (analogue with the functionality of the halo implants in planar configurations). Preferentially, the doping is localized at the bottom of the extended portion of the protruding structure as shown in FIG. 6. The step (202) depicts CMP of the overgrown semiconductor material. The step (203) illustrates the STI oxide (2) etch back (recess) to expose the fin (1). The step (204) shows formation of gate oxide (3) and gate electrode (4) around the fin in a tri-gate architecture. The step (204') is an alternative to step (204), which shows the formation of gate oxide and gate electrode in a dual-gate architecture.

The semiconductor material of the protruding structure may further comprise two or more layers, the layers being stacked vertically. This embodiment is illustrated in FIG. 7.

FIG. 7 shows schematically a fabrication process according to an embodiment of the disclosure wherein the fin comprises multiple layers (stacked up vertically) having different compositions, at least one of the layers having a horizontal gradient in composition. Preferably, all the layers (e.g., in this example both layers) have a horizontal gradient in composition. Preferably, the layers are formed by epitaxial growth, in one process step, without vacuum break, by adapting the type and/or the amount of precursors present in the epitaxial reactor.

The following process steps are represented in FIG. 7. The step (301) shows epitaxial growth of a first semiconductor material having a horizontal gradient in composition, followed by the epitaxial growth of second semiconductor material having a horizontal gradient in composition. The horizontal gradient in composition (and band gap) is illustrated by the regions "A" and "B" of the first semiconductor material and, respectively, the region "C" and "D" of the second semiconductor material. As in case of FIGS. 5 and 6, the transition between the two regions is not abrupt, instead the variation in composition and band gap is gradual in a horizontal direction.

A CMP step (not shown) of the overgrown second semiconductor material is performed. Further, STI oxide (3) etch back (recess) (303) is performed to expose the fin (1), the exposed portion of the fin is in this case made of the second semiconductor material, which is having a horizontal gradient in composition. Subsequently, formation (304) of gate oxide (3) and gate electrode (4) around the fin in a tri-gate architecture is shown. Alternatively to (304), formation of gate oxide and gate electrode in a dual-gate architecture (304').

The invention claimed is:

1. A method for manufacturing a semiconductor device comprising:
   providing a patterned substrate comprising a dielectric region and a semiconductor region;
   forming a recess in the semiconductor region having a bottom area exposing the substrate and lateral walls comprising a dielectric material;
   forming protruding structures in the recess by growing epitaxially a semiconductor material in the recess; and
   recessing back the dielectric material in the dielectric region revealing an extended portion of the protruding structures,
   wherein at least the extended portion of the protruding structures comprises the semiconductor material having an inverted 'V' band gap profile with a band gap value increasing gradually from a first value at lateral edges of the structure to a second value, higher than the first value, in a center of the structure.

2. The method of claim 1, wherein the semiconductor material is silicon germanium (SiGe) and the band gap profile is created by a gradient in Ge concentration, with the highest Ge concentration at the lateral edges of the protruding structure.

3. The method of claim 1, further comprising forming a capping layer conformal around the extended portion of the protruding structure.

4. The method of claim 1, wherein the semiconductor material further comprises dopants that are introduced by in-situ doping during the epitaxial growth or by implantation after the epitaxial growth.

5. The method of claim 1, wherein the semiconductor material of the protruding structures comprises two or more layers, and wherein the layers are stacked vertically.

6. The method of claim 1, further comprising forming a gate dielectric and gate electrode substantially conformal around the extended portion of the protruding structures.

7. The method of claim 1, wherein during the epitaxial growth of SiGe a pressure and a growth temperature are chosen such that a growth front perpendicular to the planes is favored, forming facets at the bottom area of the recess, and wherein the facets propagate but do not completely merge in order to keep a top plane during the epitaxial growth, thereby achieving a gradient in Ge concentration.

8. The method of claim 7, wherein the growth temperature is between 450° C. and 700° C. and the pressure is between 5 Torr and 1 atm.

* * * * *